United States Patent
Zhang et al.

(10) Patent No.: US 10,396,032 B2
(45) Date of Patent: Aug. 27, 2019

(54) SEMICONDUCTOR STRUCTURES

(71) Applicant: Semiconductor Manufacuring International (Shanghai) Corporation, Shanghai (CN)

(72) Inventors: Chenglong Zhang, Shanghai (CN); Haiyang Zhang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 15/704,568

(22) Filed: Sep. 14, 2017

(65) Prior Publication Data
US 2018/0012842 A1    Jan. 11, 2018

Related U.S. Application Data

(62) Division of application No. 14/884,880, filed on Oct. 16, 2015, now Pat. No. 9,793,209.

(30) Foreign Application Priority Data

Oct. 16, 2014    (CN) .......................... 2014 1 0549387

(51) Int. Cl.
*H01L 23/52*     (2006.01)
*H01L 23/528*    (2006.01)
*H01L 21/768*    (2006.01)
*H01L 21/3213*   (2006.01)
*H01L 23/532*    (2006.01)

(52) U.S. Cl.
CPC .... *H01L 23/5283* (2013.01); *H01L 21/32136* (2013.01); *H01L 21/76804* (2013.01); *H01L 21/76831* (2013.01); *H01L 21/76834* (2013.01); *H01L 21/76873* (2013.01); *H01L 21/76885* (2013.01); *H01L 21/76877* (2013.01); *H01L 23/53223* (2013.01); *H01L 23/53238* (2013.01); *H01L 23/53266* (2013.01); *H01L 2221/1089* (2013.01); *H01L 2924/0002* (2013.01)

(58) Field of Classification Search
CPC .................................................. H01L 23/5283
See application file for complete search history.

(56) References Cited

U.S. PATENT DOCUMENTS

| | | | |
|---|---|---|---|
| 2004/0084746 A1 | 5/2004 | Kim et al. | |
| 2009/0321940 A1* | 12/2009 | Kunkel | H01L 21/76802 257/758 |
| 2014/0319587 A1* | 10/2014 | Chen | H01L 24/13 257/288 |
| 2015/0017811 A1 | 1/2015 | Inoue et al. | |
| 2015/0061141 A1 | 3/2015 | Tung et al. | |
| 2015/0206872 A1 | 7/2015 | Hsu et al. | |

FOREIGN PATENT DOCUMENTS

CN    103594415 A    2/2014

* cited by examiner

*Primary Examiner* — Trang Q Tran
(74) *Attorney, Agent, or Firm* — Anova Law Group, PLLC

(57) ABSTRACT

A method is provided for fabricating a semiconductor structure. The method includes providing a semiconductor substrate; forming an initial metal layer; simultaneously forming a plurality of discrete first metal layers and openings by etching the initial metal layer; forming a plurality of sidewalls covering the side surface of the first metal layers; and forming a plurality of second metal layers to fill the openings.

11 Claims, 4 Drawing Sheets

SEMICONDUCTOR STRUCTURES

CROSS REFERENCE TO RELATED APPLICATIONS

This application is a divisional of U.S. patent application Ser. No. 14/884,880, filed on Oct. 16, 2015, which claims the priority of Chinese patent application No. 201410549387.6, filed on Oct. 16, 2014, the entirety of all of which is incorporated herein by reference.

FIELD OF THE INVENTION

The present invention generally relates to the field of semiconductor manufacturing technology and, more particularly, relates to a semiconductor structure and the fabricating process thereof.

BACKGROUND

With the progress of very-large-scale integration (VLSI) technology, the feature size of the semiconductor structure is continuously shrinking, the chip area is persistently getting bigger, and RC (R means resistance while C refers to the capacitance) delay problem of semiconductor structure becomes more and more significant. In particular, the growing influence of the line capacitance between the metal wiring results in a significant decline in device performance and it has become a key constraint to further development of the semiconductor industry.

Parasitic capacitance and interconnect resistance between metal interconnects of semiconductor structures cause transmission delay of the signal. Because copper has a relatively low resistivity, excellent anti-electromigration characteristics, and high reliability, it can be used to reduce interconnect resistance of metals, thus further reduce the total interconnect delay effect. Therefore, in semiconductor structures, the conventional aluminum interconnect has been changed to low-resistance copper interconnect.

However, with the development of semiconductor technology towards miniaturization and microminiaturization, it is urgent to provide a new semiconductor structure and a corresponding fabricating method to meet with the development trend of miniaturization of semiconductor technology.

BRIEF SUMMARY OF THE DISCLOSURE

The present disclosure includes a method for fabricating a semiconductor structure. The method includes providing a semiconductor substrate; forming an initial metal layer; simultaneously forming a plurality of discrete first metal layers and openings by etching the initial metal layer; forming a plurality of sidewalls covering the side surface of the first metal layers; and forming a plurality of second metal layers to fill the openings.

Another aspect of the present disclosure also includes a semiconductor structure. The semiconductor structure includes a semiconductor substrate, a plurality of first metal layers formed on a surface of the substrate, a plurality of sidewalls formed on side surfaces of the first metal layers; and a plurality of second metal layers covering the surfaces of the sidewalls and also filling openings between adjacent first metal layers. A cross-sectional shape of the first metal layers has a narrower upper edge and a wider lower edge such that the upper edge is shorter than the lower edge, and a cross-sectional shape of the second metal layers has a wider upper edge and a narrower lower edge.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

As described above in the background section, a new semiconductor structure and a corresponding fabricating method are desired to meet with the development trend of miniaturization and microminiaturization of semiconductor technology. In current practice, referring to FIG. 1-3, the process to form a semiconductor structure includes the following steps.

Figure 1:
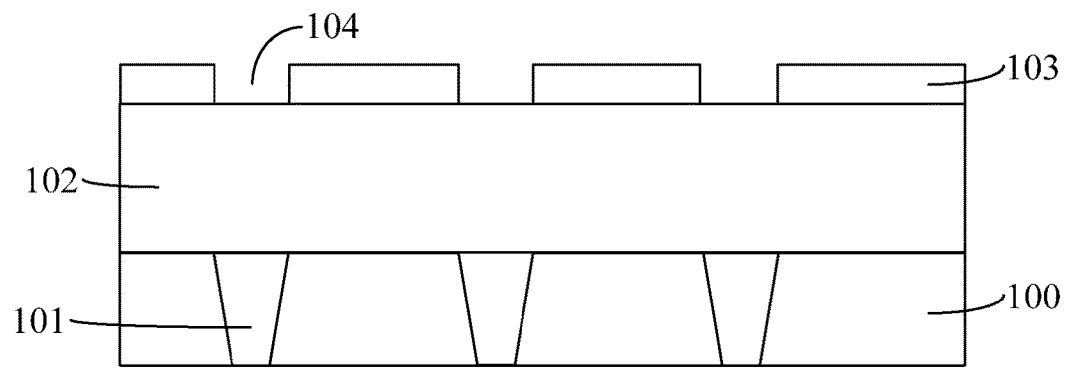
FIG. 1-3 illustrate schematic cross-section views of semiconductor structures corresponding to certain stages of a fabrication process in current practice.

As shown in FIG. 1, a substrate 100 is provided and a number of underlying metal layers 101 have been formed in the substrate 100. A dielectric layer 102 is then formed on the surface of the substrate 100 and a mask layer 103 is formed on the surface of the dielectric layer 102. Further, a number of openings 104 are formed in the mask layer 103 and the surface of the dielectric layer 102 is exposed on the bottom of the openings 104.

Figure 2:
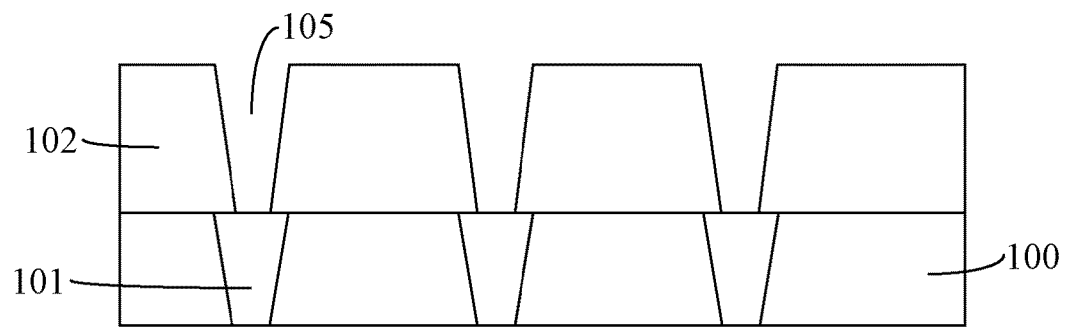

After forming the openings 104 in the mask layer 103, the dielectric layer 102 is etched along the openings 104 (referring to FIG. 1) by using the mask layer 103 (referring to FIG. 1) as a mask. As shown in FIG. 2, a number of openings 105 are then formed in the dielectric layer 102 and the surface of the substrate 100 is exposed by the openings 105. On the bottom of the openings 105, the top surface of the underlying metal layers 101 is exposed. Then, the mask layer 103 is removed. FIG. 2 shows a corresponding structure after the removal of the mask layer 103.

Figure 3:
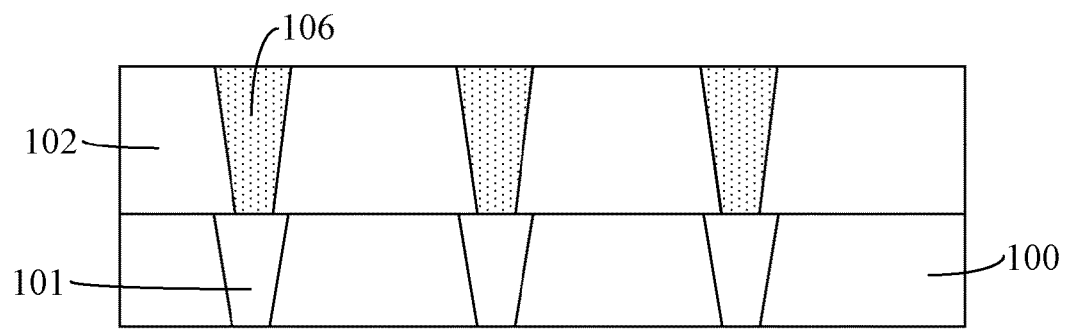

Further, as shown in FIG. 3, a number of top metal layers 106 are formed and the top metal layers 106 fill up the openings 105 (referring to FIG. 2). The top metal layers 106 also cover the top surface of the dielectric layer 102. Finally, a planarization process is performed on the top metal layers 106 until the top surface of the metal layers 106 is leveled with the top surface of the dielectric layer 102. FIG. 3 shows a corresponding structure after the planarization process.

With the continuous development of the semiconductor technology, the distance between adjacent top metal layers 101 in the substrate 100 becomes shorter and shorter, thus the distance between adjacent openings 105 is also reduced. Accordingly, the dimension of the opening 104 (shown in FIG. 1) between patterned mask layer 103 becomes smaller and smaller, while the size of the patterned mask layer 103 between adjacent openings 104 also becomes smaller and smaller.

Usually, a photolithography technique is used to form the mask layer 103 with a number of openings 104. When the size of the semiconductor structure becomes smaller and smaller, the quality and the accuracy of the mask layer 103 with a number of openings 104 formed by the photolithography technique are also affected. For example, if the actual size of an opening 104 obtained after a photolithography process is larger than the intended size of the opening 104, the distance between adjacent openings 105 (shown in FIG. 2) becomes too small, thus affecting the reliability of the semiconductor structure.

In view of the above, the present disclosure provides a fabrication method to improve the density of interconnects or conductive plugs in semiconductor structures while ensuring the reliability of the structures. Specifically, the fabrication method includes providing a semiconductor substrate; then forming an initial metal layer on a top surface of the substrate; further, forming a number of discrete first metal layers by etching the initial metal layer. During the formation of the first metal layers, a number of openings are also simultaneously formed between adjacent first metal layers. The surface of the substrate is exposed in the openings. The fabrication method further includes forming a number of sidewalls to cover the side surface of the first metal layers. The sidewalls are made of an insulating material. After forming the sidewalls, the method also includes forming a number of second metal layers to fill up the openings, and completing the semiconductor structure with a planarization process to let the top surfaces of the first metal layers, the second metal layers, and the sidewalls be all leveled with each other. According to the disclosed fabrication method, because the width of the sidewalls may be formed relatively narrow, the distance between the first metal layer and the second metal layers may also be formed relatively small. Thus, the disclosed fabrication method allows a relatively large number of the first metal layers and the second metal layers to be formed on the surface of the substrate. Therefore, the disclosed fabrication method may improve the density of interconnects or conductive plugs of the semiconductor structure, satisfying the development trend of miniaturization and microminiaturization of semiconductor technology.

Figure 10:
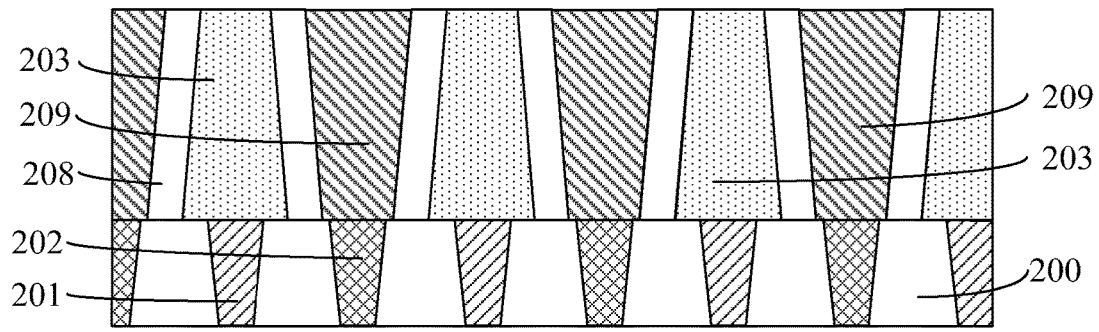
Figure 11:
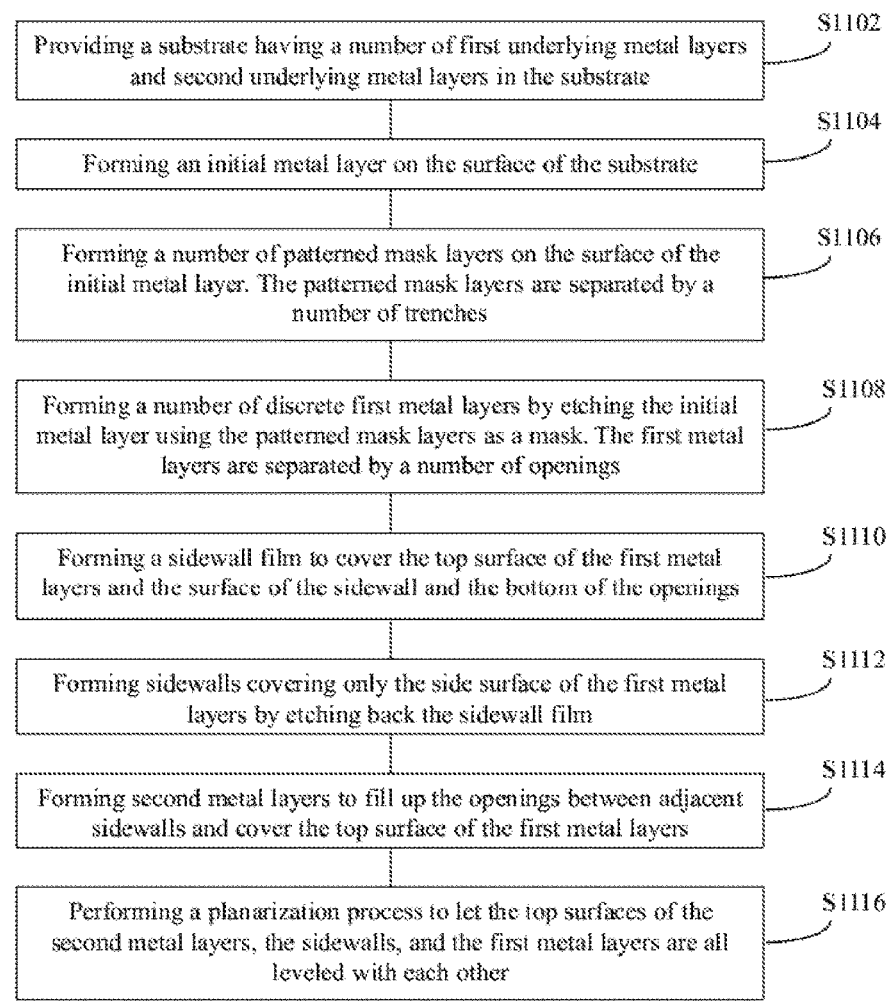
FIG. 11 illustrates an exemplary fabrication process of a semiconductor structure consistent with the disclosed embodiments.

FIG. 11 illustrates an exemplary fabrication process of a semiconductor structure consistent with the disclosed embodiments. FIG. 4~10 14 illustrate the cross-section views of the semiconductor structures corresponding to certain stages of the fabrication process of the semiconductor structure.

Figure 4:
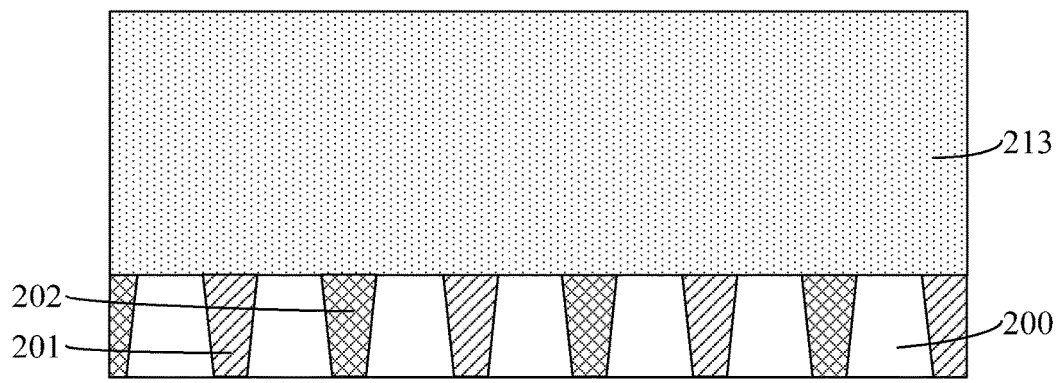
FIGS. 4-10 illustrate schematic cross-section views of semiconductor structures corresponding to certain stages of an exemplary fabrication process consistent with the disclosed embodiments.

As shown in FIG. 11, at the beginning of the fabrication process 1100 of the semiconductor structure, a semiconductor substrate 200 is provided (S1102). FIG. 4 shows a corresponding structure.

The substrate 200 may be made of any appropriate material, such as silicon, polycrystalline silicon, amorphous silicon, silicon on insulator (SOI), germanium, silicon germanium, or gallium arsenide, etc.

The substrate 200 may also have a number of interface layer or strained layer formed on the surface to improve the electrical performance of the semiconductor structure. In addition, semiconductor devices such as NMOS transistors, PMOS transistors, CMOS transistors, resistors, capacitors, or inductors may also be formed in the substrate 200.

In one embodiment, a number of first underlying metal layers 201 and second underlying metal layers 202 may be formed in the substrate 200. The top surfaces of the first underlying metal layers 201 and the second underlying metal layers 202 are both leveled with the surface of the substrate 200. In addition, the first underlying metal layers 201 in the substrate 200 may be interlaced with the second underlying metal layers 202. That is, on both sides of a first underlying metal layer 201, there is a second underlying metal layer 202 formed in the substrate 200 and, accordingly, on both sides of a second underlying metal layer 202, there is a first underlying metal layer 201.

The first underlying metal layers 201 are used to form first metal electric connections while the second underlying metal layers 202 are used to form second metal electric connections in subsequent processes. In addition, the first underlying metal layers 201 are electrically isolated from the neighboring second underlying metal layers 202. The first underlying metal layers 201 and the second underlying metal layers 202 are made of a conductive material, such as copper (Cu), aluminum (Al), or tungsten (W), etc. In one embodiment, the first underlying metal layers 201 and the second underlying metal layers 202 are both made of Cu.

Referring to FIG. 11 and FIG. 4, an initial metal layer 213 is formed on the surface of the substrate 200 (S1104). The initial metal layer 213 may be made of a conductive material, such as copper (Cu), aluminum (Al), or tungsten (W), etc. In one embodiment, the initial metal layer 213 is made of Cu.

In one embodiment, the initial metal layer 213 has a multi-layer structure. The initial metal layer 213 may include a seed layer on the surface of the substrate 200 and an initial metallic layer formed on the seed layer.

The seed layer may be used as a cathode in a subsequent plating process to further form the initial metallic layer. The seed layer may also provide a desired interface to form the initial metallic layer, facilitating the formation of an initial metallic layer tightly bonded to the seed layer, and improving the electromigration in the semiconductor structure.

In certain other embodiments, the seed layer may have a single-layer structure or a multi-layer structure, which may include at least one small-grain layer and at least one large-grain layer with different grain diameters. When the seed layer has the multi-layer structure, the small-grain layer may be formed under the large-grain layer to improve the adhesion between the seed layer and the substrate 200.

The seed layer may be formed by a physical vapor deposition process or a chemical vapor deposition process. In one embodiment, the seed layer is formed by a physical vapor deposition process. The thickness of the seed layer may be in a range of approximately 10 Å~200 Å.

The initial metallic layer may be made of Cu, the initial metallic layer may be formed by a physical vapor deposition process or an electrochemical plating process. In one embodiment, the initial metallic layer is formed by an electrochemical plating process: the substrate 200 is transferred into a plating reaction cell and then an initial metallic layer is formed on the substrate 200 by plating.

The plating reaction cell includes electroplating solution, a copper metal plating anode, and a positive pole and a negative pole of a power supply. The electroplating solution mainly composes copper sulfate, sulfuric acid, and water. The electroplating solution may also contain a variety of additives such as catalyst, inhibitor, adjustment, etc.

The plating process is as follows: the seed layer is connected to the negative pole of the power supply while the copper metal plating anode is connected to the positive pole of the power supply; oxidation reaction of the copper atoms on the copper metal anode introduces copper ions into the solution; near the surface of the seed layer, reduction reaction of copper ions in the solution produces copper atoms on the surface of the seed layer to form the initial metallic layer.

In one embodiment, because the initial metal layer 213 is formed on the surface of the substrate 200 and the dimensions of the surface area of the substrate are relatively large. The dimensions of the initial metal layer 213 on the surface of the substrate 200 are also relatively large. During the formation of the initial metal layer 213, the growth of grains is not restricted, so the grain size in the formed initial metal layer 213 is relatively large. Thus, the number of the grain surfaces in the initial metal layer 213 is less, and as a result, grain boundary scattering in the initial metal layer 213 is weak.

The initial metal layer 213 may have any appropriate thickness. In one embodiment, the thickness of the initial metal layer 213 may be in a range of approximately 100 Å~5000 Å.

After the formation of the initial metal layer 213, a planarization process may be performed to improve the flatness of the surface of the initial metal layer 213 and the quality of patterned mask layers subsequently formed on the surface of the initial metal layer 213. In one embodiment, a chemical mechanical polishing (CMP) process is adopted to planarize the initial metal layer 213. In certain other embodiments, the initial metal layer may have a single-layer structure.

Figure 5:
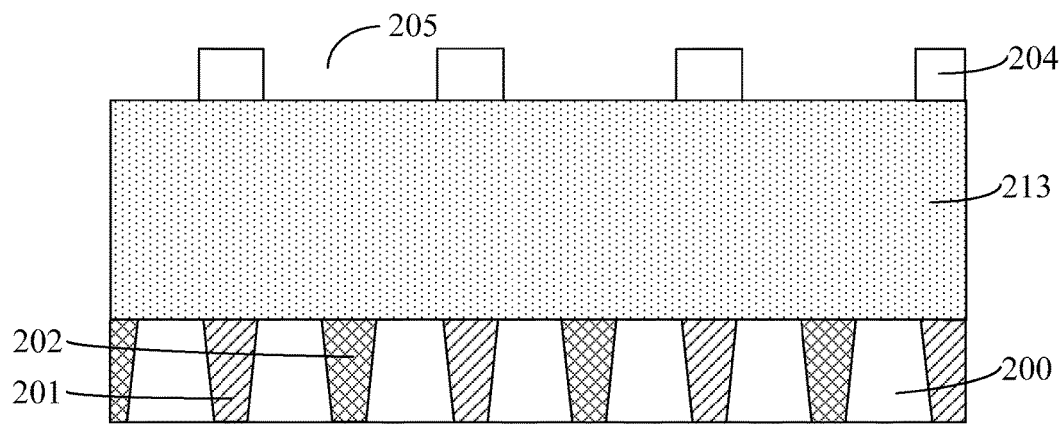

Returning to FIG. 11 and FIG. 5, after the formation of the initial metal layer 213, a number of patterned mask layers 204 may be formed on the initial metal layer 213 (S1106). During the formation of the patterned mask layers 204, a number of trenches 205 may also be simultaneously formed between adjacent patterned mask layers 204. That is, each pair of adjacent patterned mask layers 204 is separated by a trench 205. On the bottom of the trenches 205, the surface of the initial metal layer 213 is exposed. FIG. 5 shows a corresponding structure.

In a subsequent process, a number of first metal layers may be formed by patterning the initial metal layer 213. The patterned mask layers 204 are used in a subsequent process to etch the initial metal layer 213. The first metal layers are electrically connected to the first underlying metal layers 201 formed in the substrate 200. Therefore, in one embodiment, the dimension of the patterned mask layers 204 is greater than or equal to the dimension of the surface area of the first underlying metal layers 201 while the position of each patterned mask layer 204 is located right above a corresponding first underlying metal layer 201. As such, after patterning the first initial metal layer 213, the top surface of the first underlying metal layers 201 are covered by the first metal layers so that the first metal layers and the first underlying metal layers are electrically connected.

The patterned mask layers 204 may have a single-layer structure or a multi-layer structure. The patterned mask layers 204 may be made of any appropriate material, such as SiO, SiN, or a metallic material including TiN and TaN.

In one embodiment, the patterned mask layers 204 have a single-layer structure and are made of SiN. As an example, the formation process for the patterned mask layers 204 is as follows: an initial mask layer is formed to cover the surface of the initial metal layer 213; a patterned photoresist layer is then formed on the surface of the initial mask layer; a number of patterned mask layers 204 are formed interlaced with trenches 205 by etching the initial mask layer using the patterned photoresist layer as a mask until the surface of the initial metal layer 213 is exposed; finally, the patterned photoresist layer is removed.

In one embodiment, each trench 205 is located right above a surface area of the substrate 200 between two adjacent first underlying metal layers 201, thus the trenches 205 have a relatively large area. The large size of the trenches 205 may reduce the challenge during the fabrication process to form the patterned mask layers 204 and also improve the position precision and the morphology of the patterned mask layers 204.

Thus, trenches between adjacent patterned mask layers are not just located right above the first underlying metal layers or the second underlying metal layers. Although the feature sizes of the first underlying metal layers and the second underlying metal layers are small, the dimension of the trenches is relatively large, such that the process for the formation of the patterned mask layers can be simplified, and the accuracy and desired morphology of the patterned mask layers can be improved, further improving the reliability of the subsequently-formed semiconductor structure.

In certain other embodiments, a patterned mask layer may also be a photoresist layer of a multi-layer structure consisting of a coated antireflection layer and a photoresist layer.

Figure 6:
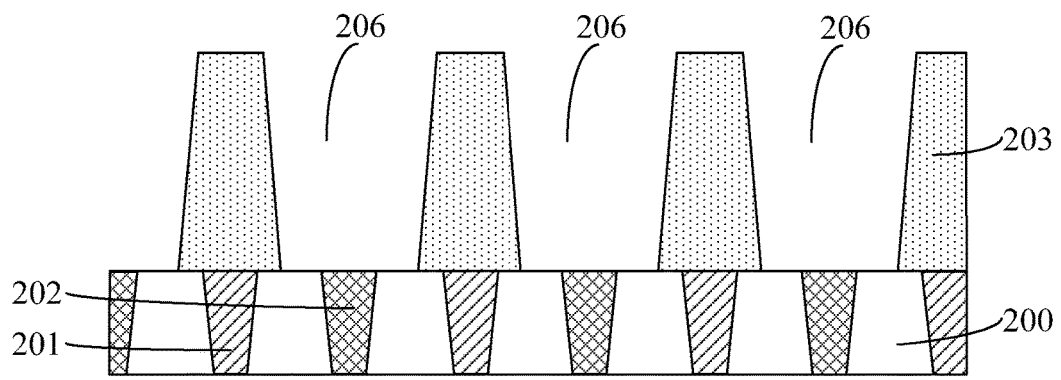

Returning to FIG. 11 and FIG. 6, after the formation of the patterned mask layers 204, a dry etching process may be performed to etch through the initial metal layer 213 (referring to FIG. 5) along the trenches 205 (referring to FIG. 5) by using the patterned mask layers 204 as a mask until the surface of the substrate 200 is exposed (S1108). FIG. 6 shows a corresponding structure after etching the initial metal layer 213.

As shown in FIG. 6, after etching the initial metal layer 213, a number of discrete first metal layers 203 may be formed on the surface of the substrate 200. Between each two adjacent first metal layers 203, an opening 206 is also simultaneously formed. The surface of the substrate 200 is exposed in the openings 206. On the bottom of the openings 206, the top surface of the second underlying metal layers is also exposed.

In one embodiment, the dimension of the openings 206 is greater than the dimension of the top surface of the second underlying metal layers 202, so that the top surface of each second underlying layer 202 may be completely covered by a subsequently-formed second metal layer.

Further, a dry etching process may be adopted to etch the initial metal layer 213. The dry etching process has a relatively large etching rate on the initial metal layer 213 but a relatively small etching rate or even no etching effect on the patterned mask layers 204. The etching gas used in the dry etching process includes $H_2$. The etching gas may also include Ar.

In one embodiment, the process parameters of the dry etching process are: the flow rate of $H_2$ may be in a range of approximately 20 sccm~200 sccm; the flow rate of Ar may be in a range of approximately 10 sccm~100 sccm; the pressure of the etching chamber may be in a range of approximately 1 Torr~20 Torr; the power of the RF source may be in a range of approximately 1500 W~3000 W; and the RF offset power may be in a range of approximately 100 W~500 W.

When increasing the etching time, byproducts of the etching process accumulate on the side surface of the openings. The accumulation of the etching byproducts further affects the etching rate of the process on the remaining initial metal layer 213. As a result, the shape of the cross-section of the openings 206 formed after the etching process has a wider upper edge and a narrower lower edge. That is, the dimension of the top surface of the openings 206 is larger than the dimension of the bottom surface of the openings 206. Therefore, the shape of the cross-section of the openings 206 is an inverted trapezoid or the like.

Accordingly, after forming the openings 206, the shape of the cross-section of the simultaneously formed first metal layers 203 has a narrower upper edge and a wider lower edge. That is, the dimension of the bottom surface of the first metal layers 203 is larger than the dimension of the top surface of the first metal layers 203. Therefore, the shape of the cross-section of the first metal layers 203 is trapezoidal or trapezoidal-like.

The first metal layers 203 are used to electrically connect with the first underlying metal layers 201 and the first metal layers 203 cover the entire top surfaces of the first underlying metal layers 201. That is, the dimension of the bottom surface of the first metal layers is greater than or equal to the dimension of the top surface of the first underlying metal layers 201.

Figure 7:
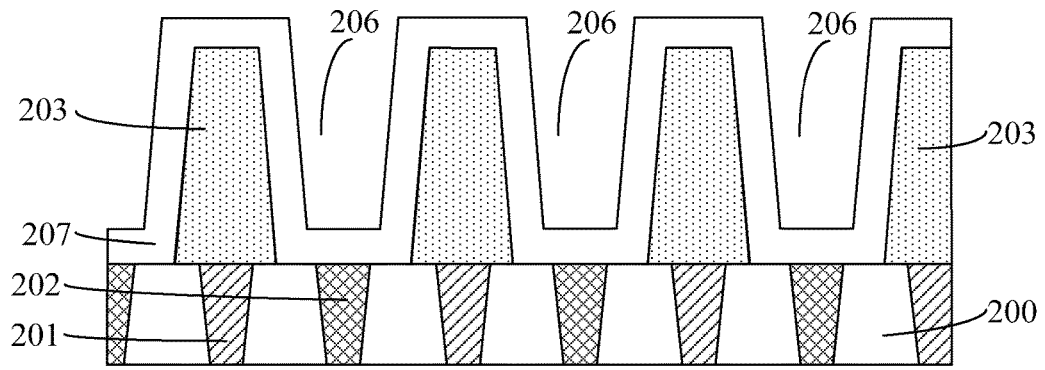

Referring to FIG. 11 and FIG. 7, after the simultaneous formation of the openings 206 and the first metal layers 203, a sidewall film 207 may be formed on the bottom surface and the side surface of the openings 206 as well as the top surface of the first metal layers 203 (S1110). The sidewall film 207 is made of an insulating material. FIG. 7 shows a corresponding structure.

The sidewall film 207 may provide a basis for subsequently-formed sidewalls covering the side surface of the first metal layers 203. The sidewall film 207 may have a single-layer structure or a multi-layer structure. The sidewall film 207 may be made of any appropriate material, such as SiO, SiN, SiON, SiC, low-k dielectric material, or ultra-low-k dielectric material. Specifically, low-k dielectric material refers to a material that has a relative dielectric constant smaller than that of the SiO but greater than 2.5; ultra-low-k dielectric material refers to a material that has a relative dielectric constant smaller than 2.5.

The low-k dielectric and ultra-low-k materials include SiCOH, FSG (fluorine doped silicon dioxide), BSG (boron doped silicon dioxide), PSG (phosphorus doped silicon dioxide), or BPSG (boron and phosphorus doped silicon dioxide). In one embodiment, the sidewall film 207 has a single-layer structure and is made of SiN.

The sidewall film 207 may be formed by a chemical vapor deposition process, a physical vapor deposition process, or an atomic layer deposition process. In one embodiment, the sidewall film 207 is formed by an atomic layer deposition process. The atomic layer deposition process may improve the filling outcome of the sidewall film 207 and prevent forming holes in the sidewall film 207 around the corner between a first metal layer 203 and the bottom of an opening 206. Therefore, the atomic layer deposition process may further prevent forming holes inside of the subsequently-formed sidewalls. If the filling outcome of the formation process for the sidewall film is poor, holes may likely be formed in the sidewall film around the corner between a first metal layer 203 and the bottom of an opening 206, thus the subsequently-formed sidewalls may also have holes, leading to poor electric isolation of the sidewalls and also affecting the reliability of the semiconductor structure. In one embodiment, the sidewall film 207 is made of SiN.

The thickness of the sidewall film may be in a range of 10 Å~100 Å. If the thickness of the sidewall film 207 is excessively large, then the thickness of the sidewalls formed subsequently may be too thick so that the surface of the second underlying metal layers 202 may be covered by the sidewalls; if the thickness of the sidewall film 207 is too thin, then the thickness of the sidewalls formed subsequently may be too thin so that the electric isolation of the sidewalls may be poor.

Figure 8:
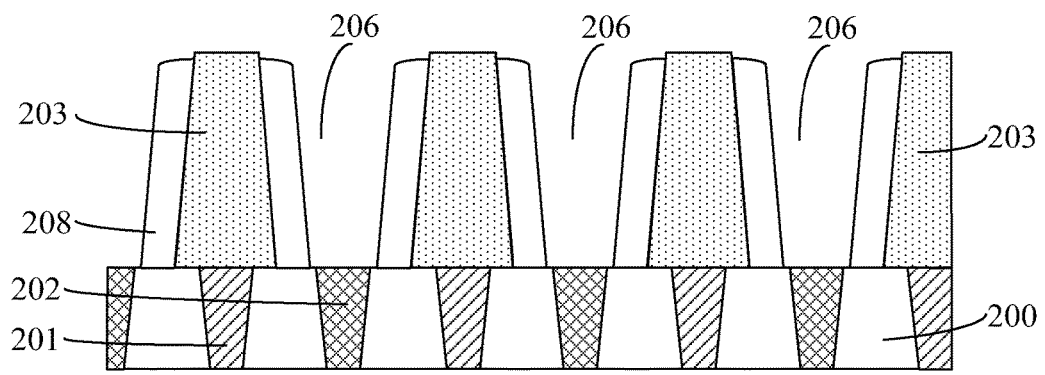

Referring to FIG. 11 and FIG. 8, after forming the sidewall film 207, an etching process is performed to etch back the sidewall film 207 and form a number of sidewalls 208 covering only the side surface of the first metal layers 203 (S1112). FIG. 8 shows a corresponding structure.

Referring to FIG. 8, the etching back process removes the portion of the sidewall film 207 (shown in FIG. 7) on the surface of the first metal layers 203 and on the surface of the bottom of the openings 206 and forms a number of sidewalls 208 covering the side surface of the first metal layers 203. The sidewalls 208 are made of an insulating material.

In one embodiment, the sidewalls 208 cover the side surface of the first metal layers 203. The sidewalls 208 are used for electric isolation. Specifically, the sidewalls 208 electrically isolate the first metal layers 203 from subsequently formed second metal layers.

A maskless etching process using fluorine-based plasma may be used to etch back the sidewall film 207. The fluorine-based plasma may be obtained by plasmatizing $CF_4$, $CHF_3$, $CH_2F_2$, $CH_3F$, or $SF_6$.

In one embodiment, the top surface of the sidewalls 208 is leveled with the top surface of the first metal layers 203. In another embodiment, the top surface of the sidewalls 208 may be lower than the top surface of the first metal layers 203. After forming second metal layers in a subsequent process, the portion of the first metal layers 203 exceeding the height of the sidewalls 208 may be simultaneously removed during the planarization of the second metal layers. As a result, the top surface of the sidewalls 208 is leveled with the top surface of the first metal layers 203.

In one embodiment, the sidewall film 207 is etched back to form the sidewalls 208 to cover the side surface of the first metal layers 203. Because the fabrication process for the sidewalls 208 does not involve the use of the photolithography technique, certain problems, such as the increasing difficulty in performing photolithography process and the deterioration in accuracy due to the reduction of feature size, may be avoided. As such, the formation process for semiconductor structures is simple and also ensures complete exposure of the top surface of the second underlying metal layer.

With the dimensions of the semiconductor structures continuously become smaller, the density of the first underlying metal layers 201 and the second underlying metal layers 202 also becomes higher, thus a shorter width for the sidewalls 208 is desired. In one embodiment, the dimension of the width of the sidewalls 208 may be controlled by adjusting the thickness of the sidewall film 207 and the process parameters in the etching back process. In addition, because the width of the sidewalls 208 is not restricted by photolithography process, the width of the sidewalls 208 may be substantially small. Therefore, the formed sidewalls 208 may meet the demand for a high density of the first underlying metal layers 201 and the second underlying metal layers 202. In the meantime, the sidewalls 208 also have strong electric isolation function so that the reliability of the semiconductor structure is also high.

Figure 9:
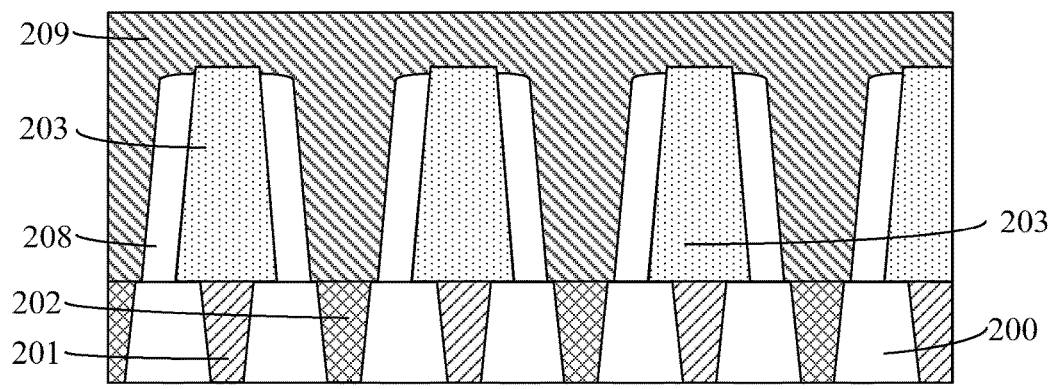

Referring to FIG. 11 and FIG. 9, after forming the sidewalls 208, a number of second metal layers 209 may be formed to fill the openings 206 (S1114). The second metal layers 209 may also cover the top surface of the first metal layers 203, and the top surface of the second metal layers 209 may be higher than the top surface of the first metal layers 203. FIG. 9 shows a corresponding structure.

The second metal layers 209 are used to electrically connect to the second underlying metal layers 202. The second metal layers 209 may have a single-layer structure or a multi-layer structure. If the second metal layer 209 has a single-layer structure, the second metal layer includes a metallic layer filling up the openings 206. If the second metal layer 209 has a multi-layer structure, the second metal layer 209 includes a barrier layer covering the bottom of the openings 206 and the side surface of the sidewalls 208 and a metallic layer covering the barrier layer and also filling up the openings 206.

The metallic layer may be made of Cu, Al, or W. The barrier layer may be made of Ti, Ta, TiN, or TaN. In one embodiment, the second metal layers 209 have a multi-layer structure with a barrier layer made of TiN and a metallic layer made of Cu. The second metal layers 209 may be formed by a chemical vapor deposition process, a physical vapor deposition process, or an atomic layer deposition process.

Referring to FIG. 11 and FIG. 10, after the formation of the second metal layers 209, a planarization process may be performed to make the top surface of the first metal layers 203, the top surface of the sidewalls 208, and the top surface of the second metal layers 209 be leveled with each other (S1116). FIG. 10 shows a corresponding structure.

A CMP process may be used for the planarization, the shape of the cross-section of the second metal layers 209 has a wider upper edge and a narrower lower edge. That is, the dimension of the top surface of the second metal layers 209 is larger than the dimension of the bottom surface of the second metal layers 209, thus the shape of the cross-section of the second metal layers 209 may be an inverted trapezoid or the like.

In one embodiment, prior to the planarization process, the top surface of the sidewalls 208 may be leveled with the top surface of the first metal layer 203. Then, by using the CMP process, the portion of the second metal layers 209 exceeding the height of the sidewalls 208 is removed so that the top surface of the second metal layers 209, the top surface of the sidewalls 208, and the top surface of the first metal layers 203 are all leveled with each other.

In another embodiment, prior to the planarization process, the top surface of the sidewalls 208 is lower than the top surface of the first metal layer 203. Then, the CMP process is used to polish the second metal layers, the sidewalls 208, and the first metal layers 203 until the top surface of the second metal layers 209, the top surface of the sidewalls 208, and the top surface of the first metal layers 203 are all leveled with each other.

In certain other embodiments, the sidewalls 208 may also be formed as follows: a mask layer with trenches may be formed on the surface of the sidewall film 207 and the portion of the sidewall film 207 formed on the top surface of the second underlying metal layers 202 is exposed by the trenches; a number of sidewalls 208 covering the side surface of the first metal layer 203 may be formed by etching the sidewall film 207 along the trenches using the mask layer as a mask until the top surface of the second underlying metal layers 202 is exposed; the portion of the sidewall film 207 formed on the top surface of the second underlying metal layers 202 is removed during the etching process and the sidewalls 208 are also formed to cover the top surface of the first metal layers 203. The dimension of the trenches is larger than or equal to the dimension of the top surface of the second underlying metal layers 202.

In one embodiment, to reduce the process difficulty in forming the mask layer and improve the accuracy and morphology of the mask layer to be formed, the dimension of the trenches is larger than the dimension of the top surface of the second underlying metal layers 202 but smaller than the distance between adjacent two first metal layers 203.

After forming the sidewalls 208, second metal layers 209 may be formed to cover the surface of the sidewalls and fill up the openings. Then, a CMP process is used to polish the second metal layers 209, the sidewalls 208, and the first metal layers 203 until the surfaces of the second metal layers 209, the sidewalls 208, and the first metal layers 203 are all leveled with each other.

The first metal layers 203 and the second metal layers 209 may be formed as interconnect or conductive plugs in the semiconductor structure. The first metal layers 203 and the first underlying metal layers 201 are electrically connected with each other while the second metal layers 209 and the second underlying metal layers 2021 are electrically connected with each other.

Therefore, according to the disclosed embodiments, process variation in photolithography process may be avoided, thus the difficulty of the fabrication process may be reduced and the cost of semiconductor manufacturing may also be cut down. In addition, the adverse effects of photolithography process due to the reduction of the dimensions of semiconductor structures may be reduced. After the formation of an initial metallic layer 213 on the surface of substrate 200, a number of discrete first metal layers 203 are formed by etching the initial metal layer 213; then a number of sidewalls 208 are formed as insulating layers on the surface of the first metal layers 203; a number of second metal layers 209 are then formed between neighboring insulating layers 208. Specifically, the sidewalls 208 are formed by a deposition process and a subsequent etching back process, thus the formation process of the sidewalls 208 may not be restricted by photolithography process. Therefore, the width of the sidewalls 208 may be substantially small, and as results, a relatively large density of interconnects and conductive plugs may be formed on the surface of the substrate 200, and a relatively high reliability of the semiconductor structure may be achieved.

In addition, the shape of the cross-section of the first metal layers 203 is trapezoidal or trapezoidal-like while the shape of the cross-section of the second metal layers 209 is an inverted-trapezoid or the like. That is the shape of the cross-section of the second metal layers 209 is complementary to that of the first metal layers 203. Because of the complementarity, the density of interconnects and conductive plugs may be further improved, thus the disclosed method may be even more ideal to meet with the development trend of miniaturization and microminiaturization of semiconductor technology.

Accordingly, the disclosed embodiment also provides a semiconductor structure. Referring to FIG. 10, the semiconductor structure may include a substrate 200 and a number of discrete first metal layers 203 formed on the surface of the substrate 200. A number of openings are formed between adjacent first metal layers 203 and the surface of the substrate 200 is exposed in the openings. The shape of the cross-section of the first metal layers 203 has a narrower upper edge and a wider lower edge.

The semiconductor structure may also include a number of sidewalls 208 formed on the side surface of the first metal layers 203. The sidewalls 208 may be made of an insulating material. The semiconductor structure may also include a number of second metal layers 209 not only covering the surface of the sidewall 208 but also filling up the openings.

The first metal layers 203 are electrically connected to the first underlying metal layers 201 and the first metal layers 203 cover the entire surface of the first underlying metal layers 201. The first metal layers 203 may be made of a metallic material, such as Cu, Al, or W. For example, the first metal layers 203 are made of Cu.

The number of the openings in the first metal layers 203 may be any integer number such as 1, 2, 3, or 8, etc. In one embodiment, two openings are formed in the first metal layers 203. A same number of the second metal layers may be formed on the surface of the substrates to fill up the openings.

The shape of the cross-section of the first metal layers 203 may have a narrower upper edge and a wider lower edge. That is, the dimension of the bottom surface of the first metal layers 203 is larger than the dimension of the top surface of the first metal layers 203, thus the shape of the cross-section of the first metal layers 203 is trapezoidal or trapezoidal-like.

The sidewalls 208 are used to electrically isolate the first metal layers 203 and the second metal layers 209. The sidewalls 208 may be made of an insulting material, such as SiO, SiN, SiC, low-k dielectric material, or ultra-low-k dielectric material.

In one embodiment, the width of the sidewalls 208 is in a range of 10 Å~100 Å. If the thickness of sidewalls 208 is too thin, then the electric isolation of the sidewalls 208 may be poor; if the thickness of the sidewalls 208 is too large, then the sidewalls 208 occupy an excessively large volume of the semiconductor structure, contradictory to the development trend of miniaturization and microminiaturization of semiconductor technology.

The second metal layers 209 are electrically connected to the second underlying metal layers 202 and the second metal layers 209 cover the entire surface of the second underlying metal layers 202. The second metal layers 209 may be made of a metallic material, such as Cu, Al, or W. In one embodiment, the second metal layers 209 are made of Cu.

The shape of the cross-section of the openings having the sidewalls 208 on the side surface has a wider upper edge and narrower lower edge. Accordingly, the shape of the cross-section of the second metal layers 209 formed to fill up the openings also has a wider upper edge and narrower lower edge. That is, the dimension of the top surface of the second metal layers 209 is larger than the dimension of the bottom surface of the first metal layers 203. Therefore, the shape of the cross-section of the first metal layers 203 is an inverted trapezoid or the like.

In certain other embodiments, the second metal layers 209 may have a multi-layer structure. The second metal layers 209 may include a barrier layer covering the side surface of the sidewalls and the bottom of the openings and a metallic layer covering the barrier layer and also filling up the openings. The barrier layer may prevent diffusion of metal atoms of the metallic layer into undesired areas. The barrier layer may be made of either TiN or TaN. The metallic layer may be made of a metallic material such as Cu, Al, or W.

The first metal layers 203 and the second metal layers 209 are used as interconnects or conductive plugs in the semiconductor structure. In one embodiment, a number of first metal layers 203 and second metal layers 209 are formed on the substrate 200. The first metal layers 203 are interlaced with the second metal layers 209 and the shape of the first metal layers 203 is complementary to that of the second metal layers 209. Specifically, the shape of the cross-section of the first metal layers 203 has a narrower upper edge and a wider lower edge while the shape of the cross-section of the second metal layers 209 has a wider upper edge and a narrower lower edge. Therefore, the space may be efficiently occupied in the semiconductor structure and the density of interconnects and conductive plugs may be improved. Thus, the semiconductor structure formed by the disclosed method may be a desired structure to meet the increasing demand of semiconductor technology progress and improve the performance of semiconductor structures.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A semiconductor structure, comprising:
   a semiconductor substrate;
   a plurality of first underlying metal layers and a plurality of second underlying metal layers formed in the substrate, the plurality of the first underlying metal layers being interlaced with the plurality of the second underlying metal layers;
   a plurality of first metal layers formed on a surface of the substrate, a cross-sectional shape of the first metal layers having a narrower upper edge and a wider lower edge;
   a plurality of second metal layers formed on the surface of the substrate, a cross-sectional shape of the second metal layers having a wider upper edge and a narrower lower edge, wherein:
      the plurality of the first metal layers are interlaced with the plurality of the second metal layers;
      the narrower upper edge of the plurality of first metal layers is leveled with the wider upper edge of the plurality of second underlying metal layers; and
      the wider lower edge of the plurality of first metal layers is leveled with the narrower lower edge of the plurality of second underlying metal layers; and
   a plurality of sidewall structures formed on the surface of the substrate, each between a first metal layer and a second metal layer.

2. The semiconductor structure according to claim 1, wherein top surfaces of the first metal layers, top surfaces of the sidewall structures, and top surfaces of the second metal layers are all leveled with one another.

3. The semiconductor structure according to claim 1, wherein the sidewall structures are made of SiO, SiN, SiON, SiC, low-k dielectric material, or ultra-low-k dielectric material, the first metal layers are made of Cu, Al, or W, and the second metal layers are made of Cu, Al, or W.

4. The semiconductor structure according to claim 1, wherein:
   the first metal layers are electrically connected to the first underlying metal layers and the second metal layers are electrically connected to the second underlying metal layers.

5. The semiconductor structure according to claim 4, wherein:
   a cross-sectional shape of the first underlying metal layer having a wider upper edge and a narrower lower edge.

6. The semiconductor structure according to claim 4, wherein:

a cross-sectional shape of the second underlying metal layer having a narrower upper edge and a wider lower edge.

7. The semiconductor structure according to claim 4, wherein:
   the first metal layer is in contact with the first underlying metal layer, and
   the second metal layer is in contact with the second underlying metal layer.

8. The semiconductor structure according to claim 1, wherein:
   the plurality of second metal layers have a single-layer structure or a multi-layer structure.

9. The semiconductor structure according to claim 8, wherein:
   when the plurality of second metal layers have a multi-layer structure, each second metal layer includes a barrier layer covering a surface portion of the substrate and a side surface of the sidewall structures, and a metallic layer covering the barrier layer.

10. The semiconductor structure according to claim 9, wherein:
    the barrier layer is made of TiN or TaN, and
    the metallic layer is made of Cu, Al, or W.

11. The semiconductor structure according to claim 1, wherein:
    each of the plurality of first underlying metal layers is formed directly on top of a corresponding first metal layer; and
    each of the plurality of second underlying metal layers is formed directly on top of a corresponding second metal layer.

* * * * *